(12) United States Patent
Ryzhikov et al.

(10) Patent No.: US 11,960,216 B2
(45) Date of Patent: Apr. 16, 2024

(54) INVARIABLE MAGNIFICATION MULTILEVEL OPTICAL DEVICE WITH TELECENTRIC CONVERTER

(71) Applicant: ASML Holding N.V., Veldhoven (NL)

(72) Inventors: Lev Ryzhikov, Norwalk, CT (US); Yuli Vladimirsky, Weston, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 17/641,212

(22) PCT Filed: Aug. 25, 2020

(86) PCT No.: PCT/EP2020/073778
§ 371 (c)(1),
(2) Date: Mar. 8, 2022

(87) PCT Pub. No.: WO2021/047903
PCT Pub. Date: Mar. 18, 2021

(65) Prior Publication Data
US 2024/0053688 A1 Feb. 15, 2024

Related U.S. Application Data

(60) Provisional application No. 62/897,675, filed on Sep. 9, 2019.

(51) Int. Cl.
*G03F 9/00* (2006.01)
(52) U.S. Cl.
CPC .......... *G03F 9/7011* (2013.01); *G03F 9/7046* (2013.01); *G03F 9/7049* (2013.01); *G03F 9/7088* (2013.01); *G03F 9/7096* (2013.01)

(58) Field of Classification Search
CPC .... G03F 9/7011; G03F 9/7046; G03F 9/7049; G03F 9/7088; G03F 9/7096
See application file for complete search history.

(56) References Cited

U.S. PATENT DOCUMENTS

| 5,680,200 A | 10/1997 | Sugaya et al. |
| 7,019,836 B2 | 3/2006 | Mishima |

(Continued)

FOREIGN PATENT DOCUMENTS

| CN | 101963766 A | 2/2011 |
| CN | 101963766 B | 2/2012 |

(Continued)

OTHER PUBLICATIONS

International Search Report and Written Opinion of the International Searching Authority directed to related International Patent Application No. PCT/EP2020/073778, dated Dec. 22, 2020; 10 pages.

(Continued)

*Primary Examiner* — Peter B Kim
(74) *Attorney, Agent, or Firm* — Sterne, Kessler, Goldstein & Fox P.L.L.C.

(57) ABSTRACT

A pre-alignment system includes a common object lens group configured to collect diffracted beams from a patterning device, wherein the common object lens group is further configured to produce telecentricity in an object space of the pre-alignment system. The pre-alignment system also includes a multipath sensory array having at least one image lens system, wherein the at least one image lens system includes a telecentric converter lens configured to produce telecentricity in an image space of the pre-alignment system.

16 Claims, 6 Drawing Sheets

(56) References Cited

U.S. PATENT DOCUMENTS

| | | |
|---|---|---|
| 7,256,869 B2 | 8/2007 | Nishi |
| 7,511,799 B2 | 3/2009 | Tel et al. |
| 7,781,237 B2 | 8/2010 | Heerens et al. |
| 10,372,046 B2 | 8/2019 | Ueda |
| 2006/0007442 A1* | 1/2006 | Heerens ................ G03F 9/7088 |
| | | 356/399 |
| 2009/0029270 A1 | 1/2009 | Otsuka et al. |

FOREIGN PATENT DOCUMENTS

| | | |
|---|---|---|
| CN | 103681426 A | 3/2014 |
| CN | 104345574 A | 2/2015 |
| CN | 108508713 A | 9/2018 |
| TW | 201635054 A | 10/2016 |

OTHER PUBLICATIONS

International Preliminary Report on Patentability directed to related International Patent Application No. PCT/EP2020/073778, dated Mar. 9, 2022; 7 pages.

Taiwanese Office Action directed to Taiwanese Patent Application No. 109130149, mailed Dec. 21, 2023; 8 pages.

\* cited by examiner

INVARIABLE MAGNIFICATION MULTILEVEL OPTICAL DEVICE WITH TELECENTRIC CONVERTER

CROSS-REFERENCE TO RELATED APPLICATIONS

This application claims priority of U.S. Provisional Patent Application No. 62/897,675, which was filed on Sep. 9, 2019, and which is incorporated herein in its entirety by reference.

FIELD

The present disclosure relates to alignment apparatuses and systems, for example, alignment sensor apparatuses for lithographic apparatuses and systems.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus includes so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

Accordingly, there is a need for a system and method to provide alignment with high accuracy and less variation.

SUMMARY

Embodiments of pre-alignment systems are described in the present disclosure.

One aspect of the present disclosure provides a pre-alignment system that includes a common object lens group configured to collect diffracted beams from a patterning device, wherein the common object lens group is further configured to produce telecentricity in an object space of the pre-alignment system. The pre-alignment system also includes a multipath sensory array having at least one image lens system, wherein the at least one image lens system includes a telecentric converter lens configured to produce telecentricity in an image space of the pre-alignment system.

In some embodiments, the telecentric converter lens includes a single optical lens. In some embodiments, the telecentric converter lens includes a glass, crystal or plastic. In some embodiments, the telecentric converter lens is created by digitally controlled cutting, the digitally controlled cutting including hot air jet cutting, water jet cutting and laser cutting.

In some embodiments, the pre-alignment system further includes a light source configured to illuminate the patterning device in a tilted angle.

In some embodiments, the pre-alignment system further includes a beam splitter configured to split the diffracted beams into two or more diffracted sub-beams.

In some embodiments, the pre-alignment system also includes a detector for each of the at least one image lens system, wherein the detector is configured to create a pre-alignment signal based on the diffracted beams.

Another aspect of the present disclosure provides a lithographic apparatus that includes an illumination system configured to condition a radiation beam, a support structure configured to support a patterning device, a substrate table configured to hold a substrate, a projection system configured to project a pattern imparted to the radiation beam by the patterning device onto a target portion of the substrate, and first and second positioners configured to position the patterning device and the substrate, respectively. The first positioner includes a pre-alignment system with at least two channels. The pre-alignment system includes a common object lens group that is configured to collect diffracted beams from the patterning device and produce telecentricity in an object space of the pre-alignment system. The pre-alignment system also includes a multipath sensory array having at least one image lens system. The at least one image lens system includes a telecentric converter lens configured to produce telecentricity in an image space of the pre-alignment system. The pre-alignment system further includes a detector for each of the at least one image lens system, wherein the detector is configured to create a pre-alignment signal based on the diffracted beams.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
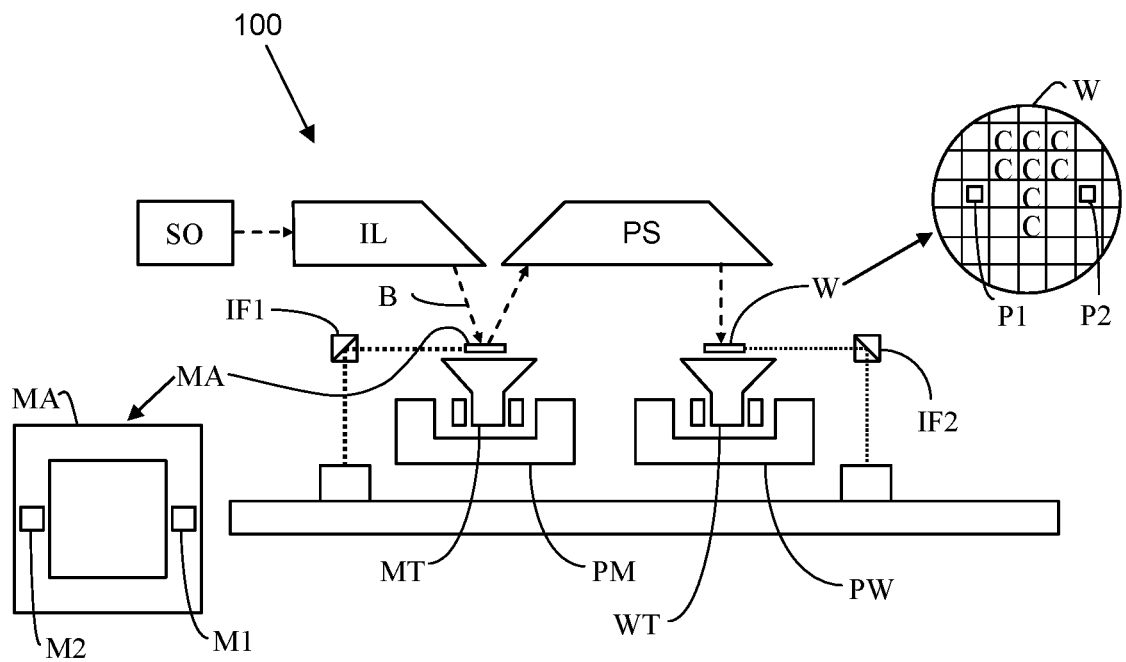
FIG. 1A is a schematic illustration of a reflective lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Example Lithographic Systems

Figure 1B:
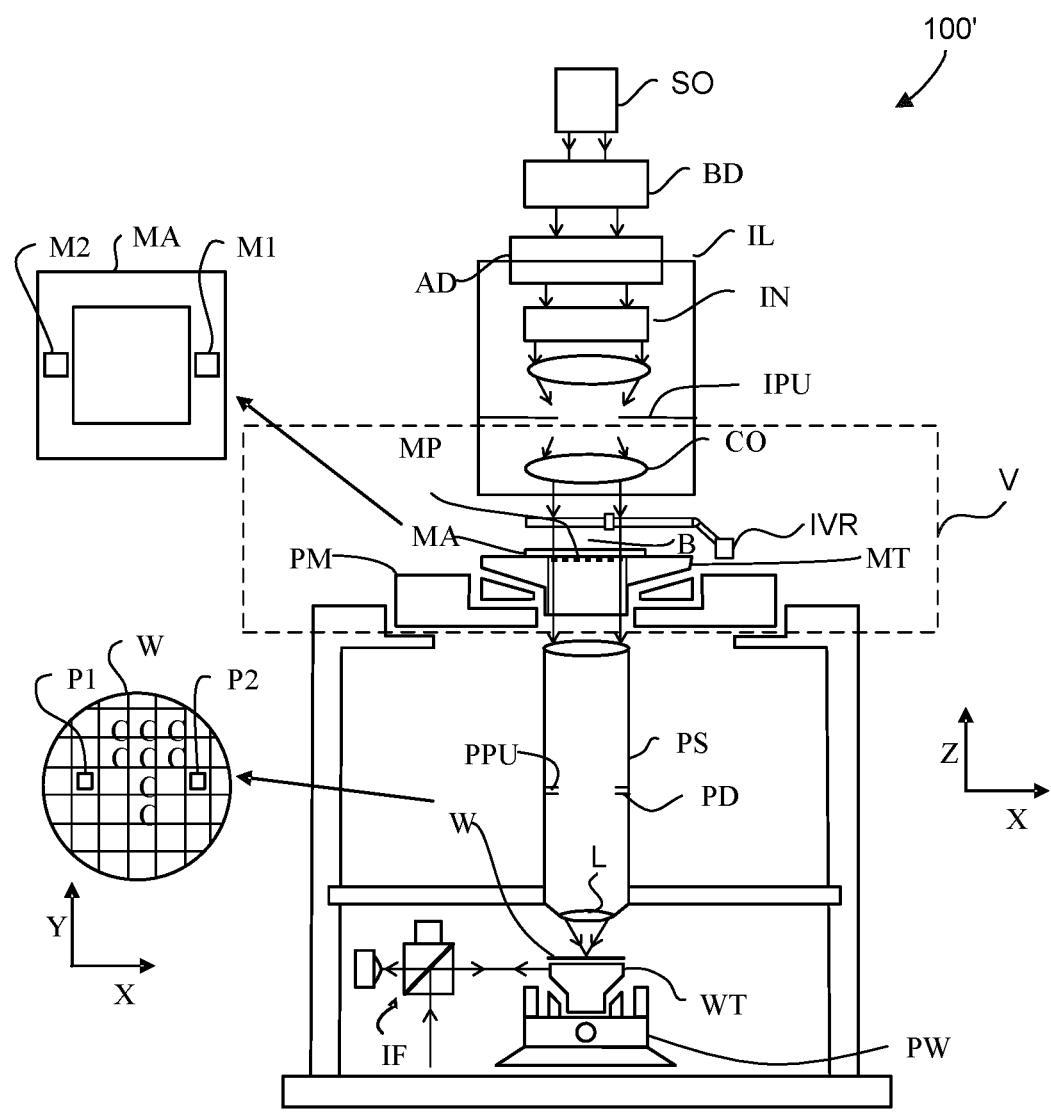
FIG. 1B is a schematic illustration of a transmissive lithographic apparatus, according to an exemplary embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
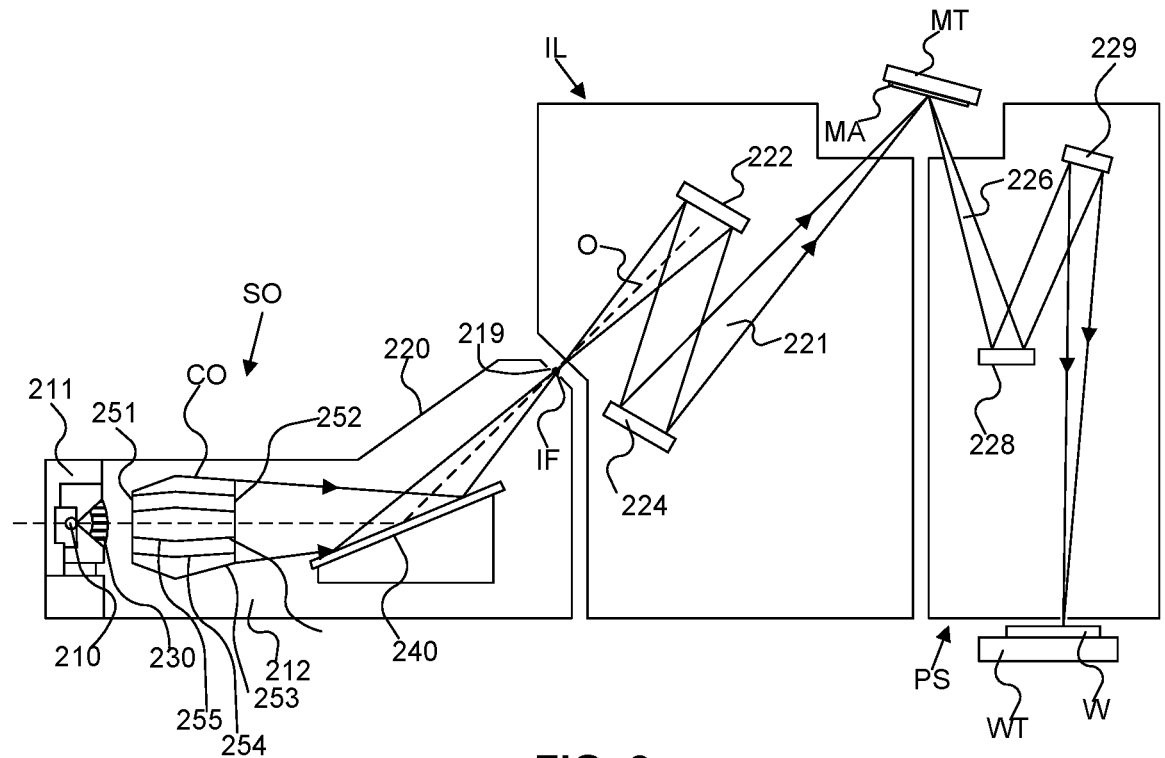
FIG. 2 is a more detailed schematic illustration of the reflective lithographic apparatus, according to an exemplary embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 20. The source collector apparatus SO includes a source chamber 11 and a collector chamber 12 and is configured to produce and transmit EUV radiation. EUV radiation may be produced by a gas or vapor, for example Xe gas, Li vapor, or Sn vapor in which an EUV radiation emitting plasma 10 is created to emit radiation in the EUV range of the electromagnetic spectrum. The EUV radiation emitting plasma 10, at least partially ionized, can be created by, for example, an electrical discharge or a laser beam. Partial pressures of, for example, 10 Pa of Xe, Li, Sn vapor, or any other suitable gas or vapor may be required for efficient generation of the radiation. In an embodiment, a plasma of excited tin (Sn) is provided to produce EUV radiation.

The radiation emitted by the EUV radiation emitting 10 is passed from the source chamber 11 into the collector chamber 12 via an optional gas barrier or contaminant trap 30 (in some cases also referred to as contaminant barrier or foil trap), which is positioned in or behind an opening in source chamber 11. The contaminant trap 30 may include a channel structure. Contamination trap 30 may also include a gas barrier or a combination of a gas barrier and a channel structure. The contaminant trap or contaminant barrier 30 further indicated herein at least includes a channel structure.

The collector chamber 12 may include a radiation collector CO, which can be a so-called grazing incidence collector. Radiation collector CO has an upstream radiation collector side 51 and a downstream radiation collector side 52. Radiation that traverses collector CO can be reflected off a grating spectral filter 40 to be focused in a virtual source point IF. The virtual source point IF is commonly referred to as the intermediate focus, and the source collector apparatus is arranged such that the intermediate focus IF is located at or near an opening 19 in the enclosing structure 20. The virtual source point IF is an image of the radiation emitting plasma 10. Grating spectral filter 240 is used in particular for suppressing infra-red (IR) radiation.

Subsequently the radiation traverses the illumination system IL, which may include a faceted field mirror device 22 and a faceted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 29 onto a substrate W held by the wafer stage or substrate table WT.

More elements than shown may generally be present in illumination optics unit IL and projection system PS. The grating spectral filter 40 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 53, 54, and 55, just as an example of a collector (or collector mirror). The grazing incidence reflectors 53, 54, and 55 are disposed axially symmetric around an optical axis O and a collector optic CO of this type is preferably used in combination with a discharge produced plasma source, often called a DPP source.

Exemplary Lithographic Cell

Figure 3:
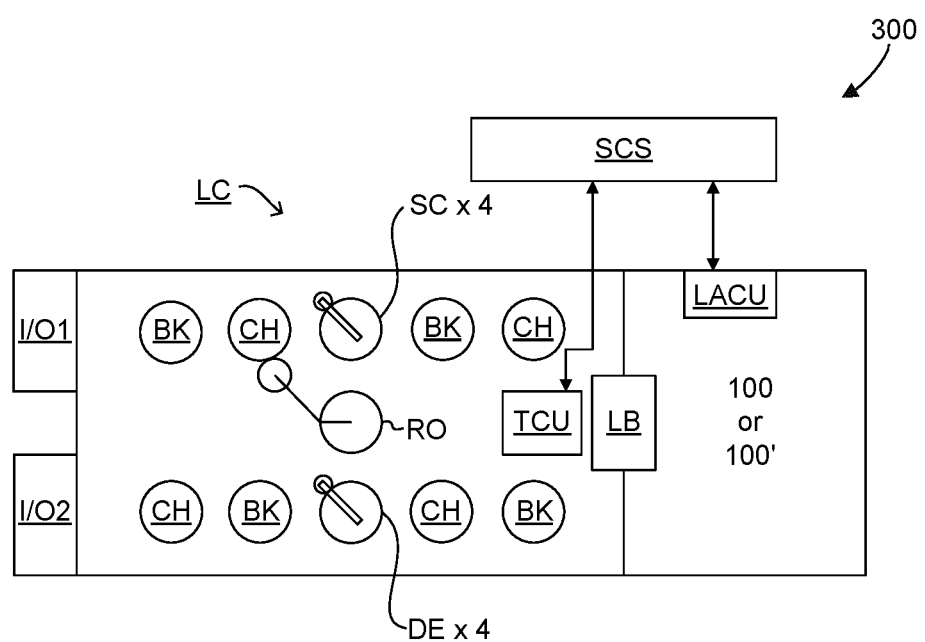
FIG. 3 is a schematic illustration of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Pre-Alignment System

Figure 4:
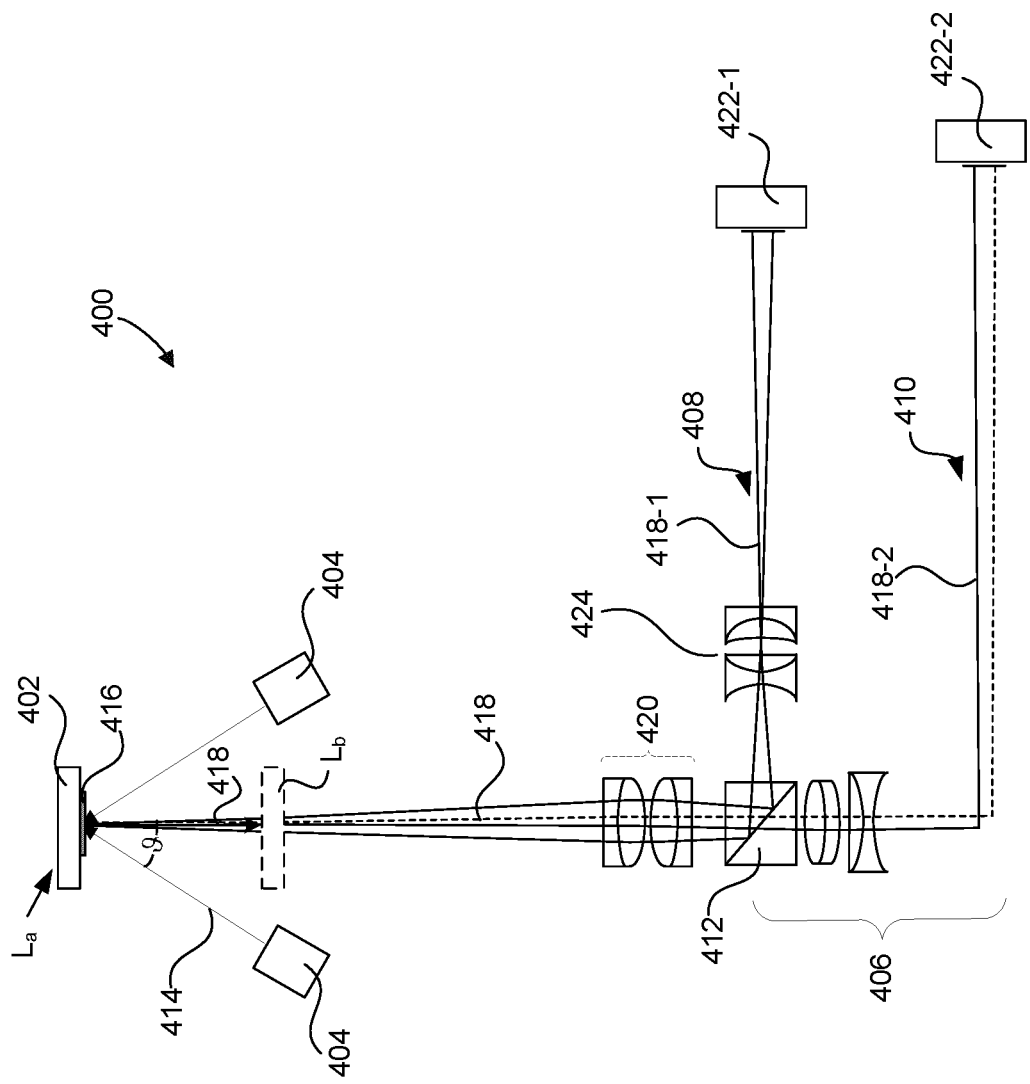
FIG. 4 illustrates a pre-alignment system configured to pre-align a patterning device, according to an embodiment of the present disclosure.

FIG. 4 shows a schematic of a pre-alignment system 400 configured to pre-align a patterning device (e.g., reticle) 402, according to some embodiments of the present disclosure. In some embodiments, the pre-alignment system 400 can be the first positioner PM used in conjunction with lithographic apparatus 100 or 100' in FIGS. 1A and 1B. In some embodiments, pre-alignment system 400 includes at least two channels. In some embodiments, pre-alignment system 400 includes a light source 404 and a multipath sensory array 406, wherein the multipath sensory array 406 provides the at least two channels for the pre-alignment system 400.

Light source 404 is configured to illuminate reticle 402 with a radiation beam 414 of a pre-determined wavelength used for reticle pre-alignment. In an embodiment, radiation beam 414 generated by light source 404 is in a near-infrared region of 650 nm to 1000 nm. In another embodiment, radiation beam 414 of a wavelength of 880 nm can be used. The wavelength of radiation beam 414 generated by light source 404 for reticle pre-alignment can be in other optical ranges, for example, can be visible light between 390 nm to 700 nm, as understood by a person skilled in the art. In an embodiment, light source 404 includes dual light sources 404a and 404b. In some embodiments, light source 404 can include a single light source or more than two light sources.

In some embodiments, pre-alignment system 400 is configured to direct radiation beam 414 onto an alignment mark 416 of reticle 402 at a tilted angle. Depending on the illumination, alignment mark 416 can reflect the light and produce a diffracted beam 418, where the angle 1 between the diffracted beam 418 and the radiation beam 414 corresponds to a diffraction angle.

In some embodiments, reticle 402 can be a reflective patterning device used for Extreme Ultraviolet (EUV) Lithography. In some embodiments, reticle 402 can be reticle MA and alignment mark 416 can be alignment targets M1 and M2, as shown in FIGS. 1A and 1B.

In some embodiments, pre-alignment system 400 is configured to direct diffracted beam 418 to multipath sensory array 406 using a common object lens group 420 and a beam splitter 412.

The multipath sensory array 406 can include one or more systems, e.g., optical, image, or lens systems, each including a path, e.g., light path, light channel, lens channel, or the like. In one embodiment, multipath sensory array 406 includes an upper image lens system 408 and a lower image lens system 410, each corresponding to a channel of the pre-alignment system 400. In this example, pre-alignment system 400 is also referred to as bifurcated reflective pre-alignment system. In some embodiments, the beam splitter 412 locates in between the common object lens group 420 and the upper/lower image lens systems 408/410. In some embodiments, beam splitter 412 may split the received diffracted beam 418 into two diffracted sub-beams 418-1 and 418-2, the first may be directed onto upper image lens system 408, and the second may be directed towards lower image lens system 410. In some embodiments, the image lens system of the multipath sensory array 406 can also include an independent lens group 424.

In some embodiments, pre-alignment system 400 also includes a detector 422 and a controller (not shown in FIG. 4) for each of the upper and lower image lens systems 408 and 410. The detector 422 can be a sensor or an array of sensors. Each sensor can be a light detector (e.g., a photodiode), an image sensor, or the like. The controller can generate a control signal used to pre-align reticle 402 based on diffracted beams 418.

In some embodiments, pre-alignment system 400 utilizes the two-channel configuration described in FIG. 4 to measure patterning device position offsets. For example, pre-alignment system 400 may utilize the upper and lower image lens systems 408 and 410 to measure the X-Y position and the orientation of reticle 402.

In some embodiments, the upper and lower image lens systems 408 and 410 can be set up with different configurations to measure different characteristics of the diffracted beam 418. For example, when reticle 402 is illuminated, the incident light (e.g., radiation beam 414) can be diffracted (or scattered in some embodiments) and partially modified by alignment marks 416 on reticle 402. Upon receiving diffracted beam 418, the upper and lower image lens systems 408 and 410 can provide analysis and measurements for different optical characteristics of reticle 402. In one example, upper image lens system 408 may receive diffracted sub-beam 418-1 and project an image of the alignment mark 416 of reticle 402 onto detector 422-1. Similarly, lower image lens system 410 may receive diffraction sub-beam 418-2 and project another image of the alignment mark 416 onto detector 422-2. In some embodiments, lower image lens system 410 can produce inverted image of reticle 402 to measure different alignment and/or positioning attributes.

In some embodiments, detector 422 can be configured to measure X- and Y-positions of reticle 402 by processing the images of the alignment mark 416 on the reticle 402. Additionally, detector 422 can be a bar code reader configured to read an identification code of the reticle 402. In some embodiments, the upper and lower lens systems 408 and 410 can be configured to perform other optical measurement and analysis of images of reticle 402.

In some embodiments, pre-alignment system 400 can also include a patterning device transfer apparatus (e.g. in-vacuum robot IVR in FIG. 1B), which can be configured to minimize patterning device (such as reticle 402) exchange time, particle generation, and reduce contact forces or stresses from a chuck and/or a patterning device. The in-vacuum robot IVR can also increase overall throughput in a patterning device exchange process for lithography, for example, in lithographic apparatus 100 or 100' in FIGS. 1A and 1B.

Telecentricity and Exemplary Pre-alignment System

In some embodiments, pre-alignment system 400 can be used to pre-align reticle 402 on two independent levels ($L_a$ and $L_b$) with a vertical separation. (see FIG. 4). The vertical separation can be, for example, in a range of 1 mm to 100 mm. In some embodiments, telecentricity can be created for pre-alignment system 400, where an image magnification of reticle 402 can remain the same when a distance between reticle 402 and common object lens groups 420 changes. In the other words, the patterning device (e.g., reticle 402) can locate at a plurality of working distances away from the common object lens group 420 and the pre-alignment system 400 can be configured to provide the same magnification of the patterning device at the detector (e.g., detector 422-1, 422-2, etc.) of each of the at least one image lens system (e.g., the upper/lower image lens system 408/410).

In some embodiments, lenses have angular fields of view such that as the distance between the lens and object increases, the magnification decreases. Therefore, when using these lenses for common object lens group 420, the angular field of view can result in perspective error, which can decrease accuracy in measurement as the detected image will change if the object (i.e., reticle 402) is moved. Telecentric lenses can eliminate the perspective error by having a constant and non-angular field of view. At various distances from the lens, a telecentric lens can provide the same field of view of the object. In this example, telecentric lens produces telecentricity in an object space.

In some embodiments, a telecentric lens can also produce telecentricity in an image space, where the telecentric lens can be a compound lens with an exit pupil at a far distance. A chief ray, passing through the center of an aperture stop, can propagate in parallel to the optical axis behind the optical system.

Figure 5:
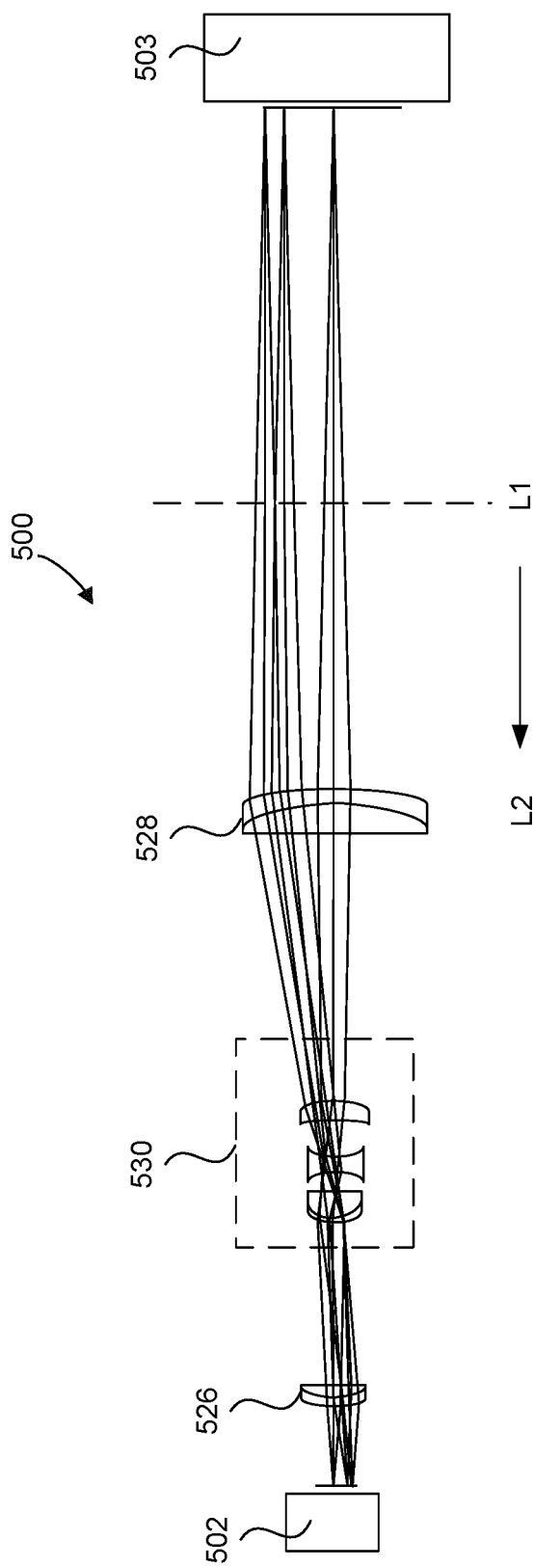
FIG. 5 illustrates an exemplary double telecentric optical system, according to an embodiment of the present disclosure.

FIG. 5 illustrates an exemplary double telecentric optical system 500, wherein both objective-space and image-space are telecentric, according to some embodiments. The chief ray can be parallel to the optical axis in both object and image space. In some embodiments of double telecentric optical system 500, image of an object 502 is insensitive to magnification variation or locations of the object 502 or an image sensor 503.

In some embodiments, double telecentric optical system 500 includes first and second lenses 526 and 528. Each of the first and second lenses 526 and 528 can be a relay lens made from an optical lens or a lens group that extends and/or inverts the image of object 502. In some embodiments, focal points of the first and second lenses 526 and 528 can be placed at the same location.

In some embodiments, double telecentric optical system 500 can provide a magnified image of object 502. For example, lithography apparatus 100 or 100' can be configured to provide a magnification value in a range of 2 to 6 for reticle MA to achieve high resolution patterning. In some embodiments, a ratio of the focal length of first and second lenses 526 and 528 corresponds to the magnification value of the image of object 502. As such, in an optical system with high magnification, it can be challenging to achieve double telecentricity with a compact design.

In some embodiments, double telecentric optical system 500 can also include a collector lens group 530, wherein the collector lens group 530 has a negative optical power and can provide more compact design for the double telecentric optical system 500. For example, second lens 528 of double telecentric optical system 500 can be closer to the first lens 526 with the addition of collector lens group 530, moving from location L1 to L2 as illustrated in FIG. 5. However, in some embodiments the overall dimension of double telecentric optical system 500 may be limited by magnification requirement, as well as the dimension of the collector lens group 530.

Referring back to FIG. 4, pre-alignment system 400 can be configured to provide telecentricity in the object space, wherein image of reticle 402 is insensitive to magnification or location of reticle 402. However, it can be challenging to design pre-alignment system 400 with a compact dimension and having telecentricity in the image space. As such, pre-alignment system 400 can be semi-telecentricity, and it may perform many iterations in compensator adjustments to achieve reliable performance.

Figure 6:
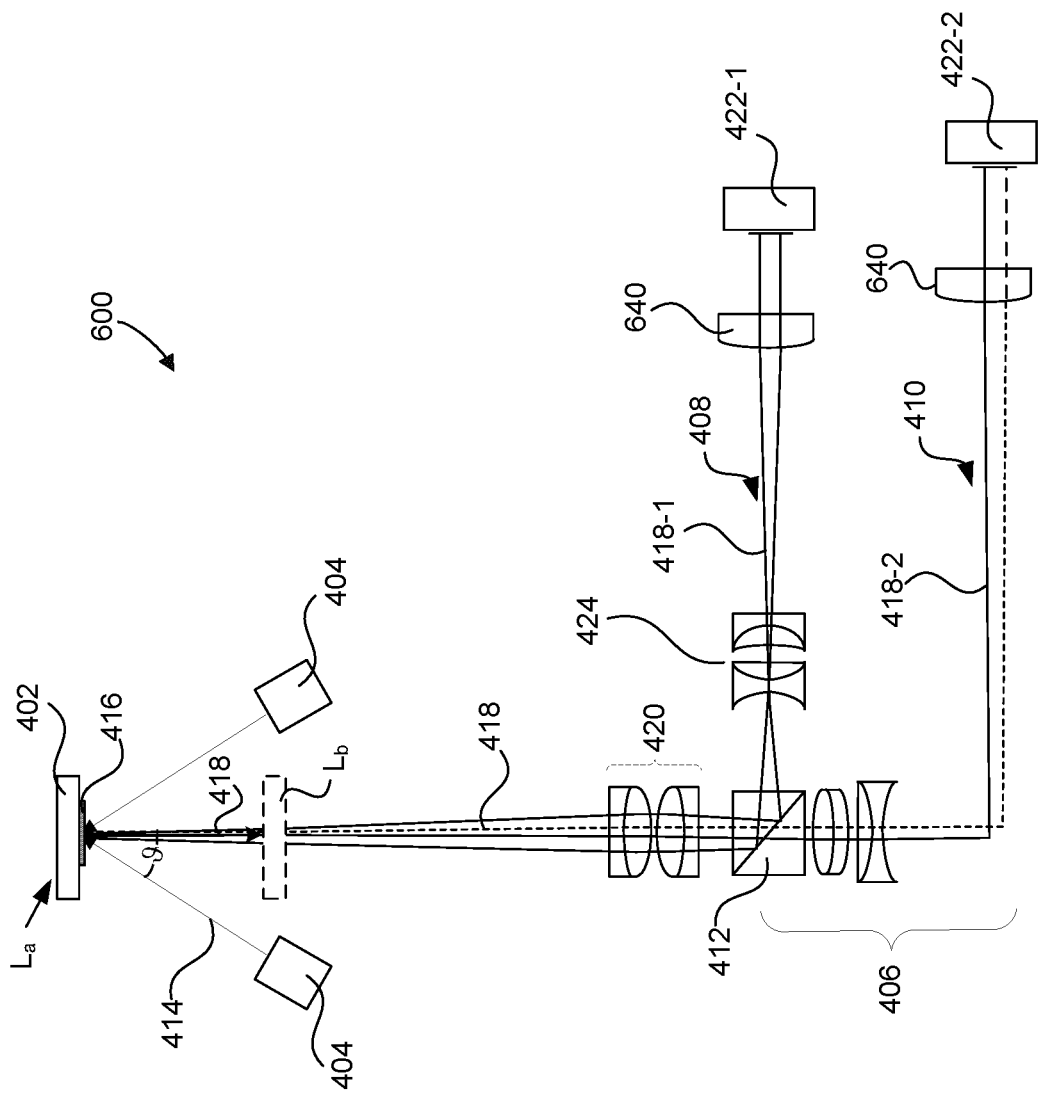
FIG. 6 illustrates a pre-alignment system with double telecentricity, according to an embodiment of the present disclosure.

FIG. 6 shows a schematic of a pre-alignment system 600, according to some embodiments of the present disclosure. Pre-alignment system 600 can be similar to pre-alignment system 400 and also has telecentricity in the object space. However, pre-alignment system 600 can include one or more telecentric converter lenses 640, configured to provide telecentricity also in the image space for pre-alignment system 600. For example, the chief ray in front of the detector 422 is parallel to the optical axis, or equivalently that the pupil is at infinity in the image space, as shown in FIG. 6.

In some embodiments, telecentric converter lens 640 can be a single optical lens positioned near an image plane (e.g., near the detector 422) to convert diffraction beams 418-1 in the image space into a telecentric beam. In the other words, the telecentric convert lens 640 can produce telecentricity in the image space for the image lens system (e.g., the upper or lower image lens system 408 and 410) of the pre-alignment system 600. By using a single optical lens, the optical design can be compact and changes from pre-alignment system 400 to pre-alignment system 600 can be minimized.

In some embodiments, telecentric converter lens 640 can be made of material such as glass, crystal, plastic, or the like or any combination thereof. The curvature (e.g., three-dimensional profile) of the telecentric converter lens 640 can be designed based on numerical simulation, for example, ray tracing. As such, three-dimensional (3D) profile or shape of the telecentric converter lens 640 can be custom designed to produce telecentricity for each diffraction sub-beam (e.g., 418-1, 418-2, etc.) of multipath sensory array 406.

In some embodiments, numeric simulation with paraxial ray tracing can be used for pre-alignment system 600 having an optical axis, where the 3D shape of telecentric converter lens 640 can be obtain without taking account of surface tilts, surface types such as splines, holograms, gradient index, diffractive elements, or the like.

In some embodiments, numeric simulation with real ray tracing can be performed to find the 3D profile of telecentric converter lens 640. Real rays (or exact rays) obey Snell's law. In some embodiments, a simulation program can use two types of real rays to evaluate the pre-alignment system 600, for example, an ordinary ray and a reference ray. The ordinary ray can be a ray starting from a given point on the object surface (e.g., a surface of alignment mark 416 on patterning device 402), in a predetermined direction, tracing through the pre-alignment system 600. The reference ray can be a ray staring from a given point on the object surface, in a direction that is initially unknown. The direction of the reference ray can be determined by the requirement that the ray pass through some predetermined interior points in the pre-alignment system 600. In one example, a chief ray can be used as the reference ray, where the chief ray emanates from the edge of the optical field and pass through the center of the aperture stop.

In some embodiments, the telecentric converter lens 640 with a desired 3D profile can be created based on simulated results. The desired 3D profile of the telecentric converter lens 640 can be created by using digitally controlled cutting, for example, hot air jet cutting, water jet cutting, laser cutting, or a combination thereof. Hot air jet cracks the lens material (e.g., glass) by introducing thermal stresses in the material. The crack propagates in the direction of the hot air jet because thermal stresses are high in the zone of the jet impingement. High pressure water jet can also cut glass into desired 3D profile. In some embodiments, abrasive and nonabrasive waterjet cutting techniques can be used in glass cutting. In nonabrasive technique, only pure deionized high pressure water is used, while in abrasive cutting technique an abrasive material like garnet, olivine, silica, etc., can be also used with high pressure water. In some embodiments, excimer laser ablation can be used to produce the desired 3D profile for the telecentric converter lens 640. High power laser, for example, $CO_2$, Nd:YAG or argon laser, can be used. In some embodiments, short-pulse laser ranging from nanoseconds to femto-seconds can be implemented. In some embodiments, the laser can be in a continuous-wave (CW) mode. In some embodiments, creating the desired 3D profile for the telecentric converter lens 640 can also include grounding, mechanical polishing, molding, milling, or a combination thereof.

The embodiments may further be described using the following clauses:

1. A pre-alignment system with at least two channels, comprising:
   a common object lens group configured to collect diffracted beams from a patterning device, wherein the common object lens group is further configured to produce telecentricity in an object space of the pre-alignment system;
   a multipath sensory array comprising at least one image lens system, wherein the at least one image lens system comprises:
      a telecentric converter lens configured to produce telecentricity in an image space of the pre-alignment system; and
   a detector for each of the at least one image lens system, wherein the detector is configured to create a pre-alignment signal based on the diffracted beams.

2. The pre-alignment system of clause 1, wherein the telecentric converter lens comprises a single optical lens.

3. The pre-alignment system of clause 2, wherein the telecentric converter lens comprises a glass, crystal or plastic.

4. The pre-alignment system of clause 2, wherein the telecentric converter lens is created by digitally controlled cutting, the digitally controlled cutting comprising hot air jet cutting, water jet cutting and laser cutting.

5. The pre-alignment system of clause 1, further comprising:
   a light source configured to illuminate the patterning device in a tilted angle.

6. The pre-alignment system of clause 1, further comprising:
   a beam splitter configured to split the diffracted beams into two or more diffracted sub-beams.

7. The pre-alignment system of clause 6, wherein the beam splitter locates between the common object lens group and the at least one image lens system.

8. The pre-alignment system of clause 1, wherein the patterning device locates at a plurality of working distances away from the common object lens group and the pre-alignment system is configured to provide the same magnification of the patterning device at the detector of each of the at least one image lens system.

9. A lithographic apparatus, comprising:
   an illumination system configured to condition a radiation beam;
   a support structure configured to support a patterning device;
   a substrate table configured to hold a substrate;
   a projection system configured to project a pattern imparted to the radiation beam by the patterning device onto a target portion of the substrate; and
   first and second positioners configured to position the patterning device and the substrate, respectively, wherein the first positioner comprises:
      a pre-alignment system with at least two channels, comprising:
         a common object lens group configured to collect diffracted beams from the patterning device, wherein the common object lens group is further configured to produce telecentricity in an object space of the pre-alignment system;
         a multipath sensory array comprising at least one image lens system, wherein the at least one image lens system comprises:
            a telecentric converter lens configured to produce telecentricity in an image space of the pre-alignment system; and
         a detector for each of the at least one image lens system, wherein the detector is configured to create a pre-alignment signal based on the diffracted beams.

10. The lithographic apparatus of clause 9, wherein the telecentric converter lens comprises a single optical lens.

11. The lithographic apparatus of clause 10, wherein the telecentric converter lens comprises a glass, crystal or plastic.

12. The lithographic apparatus of clause 10, wherein the telecentric converter lens is created by digitally controlled cutting, the digitally controlled cutting comprising hot air jet cutting, water jet cutting and laser cutting.

13. The lithographic apparatus of clause 9, further comprising:
a light source configured to illuminate the patterning device in a tilted angle.

14. The lithographic apparatus of clause 9, further comprising:
a beam splitter configured to split the diffracted beams into two or more diffracted sub-beams.

15. The lithographic apparatus of clause 14, wherein the beam splitter locates between the common object lens group and the at least one image lens system.

16. The lithographic apparatus of clause 9, wherein the patterning device locates at a plurality of working distances away from the common object lens group and the pre-alignment system is configured to provide the same magnification of the patterning device at the detector of each of the at least one image lens system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A pre-alignment system with at least two channels, comprising:
a common object lens group configured to collect diffracted beams from a patterning device, wherein the common object lens group is further configured to produce telecentricity in an object space of the pre-alignment system;

a multipath sensory array comprising at least one image lens system, wherein the at least one image lens system comprises:

a telecentric converter lens configured to produce telecentricity in an image space of the pre-alignment system; and a detector for each of the at least one image lens system, wherein the detector is configured to create a pre-alignment signal based on the diffracted beams.

2. The pre-alignment system of claim 1, wherein the telecentric converter lens comprises a single optical lens.

3. The pre-alignment system of claim 2, wherein the telecentric converter lens comprises a glass, crystal or plastic.

4. The pre-alignment system of claim 2, wherein the telecentric converter lens is created by digitally controlled cutting, the digitally controlled cutting comprising hot air jet cutting, water jet cutting and laser cutting.

5. The pre-alignment system of claim 1, further comprising:

a light source configured to illuminate the patterning device in a tilted angle.

6. The pre-alignment system of claim 1, further comprising:

a beam splitter configured to split the diffracted beams into two or more diffracted sub-beams.

7. The pre-alignment system of claim 6, wherein the beam splitter locates between the common object lens group and the at least one image lens system.

8. The pre-alignment system of claim 1, wherein the patterning device locates at a plurality of working distances away from the common object lens group and the pre-alignment system is configured to provide the same magnification of the patterning device at the detector of each of the at least one image lens system.

9. A lithographic apparatus, comprising:

an illumination system configured to condition a radiation beam;

a support structure configured to support a patterning device;

a substrate table configured to hold a substrate;

a projection system configured to project a pattern imparted to the radiation beam by the patterning device onto a target portion of the substrate; and first and second positioners configured to position the patterning device and the substrate, respectively, wherein the first positioner comprises:

a pre-alignment system with at least two channels, comprising:

a common object lens group configured to collect diffracted beams from the patterning device, wherein the common object lens group is further configured to produce telecentricity in an object space of the pre-alignment system;

a multipath sensory array comprising at least one image lens system, wherein the at least one image lens system comprises:

a telecentric converter lens configured to produce telecentricity in an image space of the pre-alignment system; and a detector for each of the at least one image lens system, wherein the detector is configured to create a pre-alignment signal based on the diffracted beams.

10. The lithographic apparatus of claim 9, wherein the telecentric converter lens comprises a single optical lens.

11. The lithographic apparatus of claim 10, wherein the telecentric converter lens comprises a glass, crystal or plastic.

12. The lithographic apparatus of claim 10, wherein the telecentric converter lens is created by digitally controlled cutting, the digitally controlled cutting comprising hot air jet cutting, water jet cutting and laser cutting.

13. The lithographic apparatus of claim 9, further comprising:

a light source configured to illuminate the patterning device in a tilted angle.

14. The lithographic apparatus of claim 9, further comprising:

a beam splitter configured to split the diffracted beams into two or more diffracted sub-beams.

15. The lithographic apparatus of claim 14, wherein the beam splitter locates between the common object lens group and the at least one image lens system.

16. The lithographic apparatus of claim 9, wherein the patterning device locates at a plurality of working distances away from the common object lens group and the pre-alignment system is configured to provide the same magnification of the patterning device at the detector of each of the at least one image lens system.

* * * * *